(12) United States Patent
Morita et al.

(10) Patent No.: US 6,614,643 B1
(45) Date of Patent: Sep. 2, 2003

(54) SEMICONDUCTOR DEVICE HAVING A CAPACITOR ELEMENT

(75) Inventors: Kiyoaki Morita, Hyogo (JP); Kenji Yoshiyama, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 5 days.

(21) Appl. No.: 10/286,911

(22) Filed: Nov. 4, 2002

(30) Foreign Application Priority Data

Apr. 24, 2002 (JP) ........................................ 2002-122592

(51) Int. Cl.⁷ ............................................... H01G 4/228
(52) U.S. Cl. ................. 361/306.3; 361/313; 361/301.3; 361/301.4
(58) Field of Search .................... 361/306.3, 311, 361/312, 313, 321.2, 329, 301.3, 301.4; 257/300, 303, 306, 310, 528, 532

(56) References Cited

U.S. PATENT DOCUMENTS

| | | | | | |
|---|---|---|---|---|---|
| 5,086,370 A | * | 2/1992 | Yasaitis | ....................... | 361/313 |
| 5,349,494 A | * | 9/1994 | Ando | ......................... | 361/322 |
| 5,369,296 A | * | 11/1994 | Kato | ............................ | 257/295 |
| 5,377,072 A | * | 12/1994 | Sparkman et al. | ........ | 361/306.2 |
| 5,448,445 A | * | 9/1995 | Yamate et al. | ............... | 361/304 |
| 5,563,762 A | * | 10/1996 | Leung et al. | ............. | 361/301.4 |
| 5,926,359 A | | 7/1999 | Greco et al. | | |
| 5,973,911 A | * | 10/1999 | Nishioka | ..................... | 361/313 |

FOREIGN PATENT DOCUMENTS

| | | |
|---|---|---|
| JP | 2000-101023 | 4/2000 |
| JP | 2000-228497 | 8/2000 |

OTHER PUBLICATIONS

U.S. patent application Ser. No. 09/986,578, Yoshiyama et al., filed Nov. 9, 2001.

* cited by examiner

*Primary Examiner*—Anthony Dinkins
(74) *Attorney, Agent, or Firm*—McDermott, Will & Emery

(57) ABSTRACT

In an MIM capacitor element, a leak guard that covers an upper layer electrode layer is provided between upper layer electrode layer and a reflection prevention film and, therefore, a region is not formed wherein upper layer electrode layer and reflection prevention film make a direct contact with each other. As a result, it becomes possible to completely prevent the generation of a leak current between upper layer electrode layer and reflection prevention film. Thus, an improvement in the structure of the MIM capacitor element and an improvement in a manufacturing process for the same can be achieved, thereby it becomes possible to provide a semiconductor device wherein the reliability of the MIM capacitor element can be enhanced.

5 Claims, 8 Drawing Sheets

SEMICONDUCTOR DEVICE HAVING A CAPACITOR ELEMENT

BACKGROUND OF THE INVENTION

1. Field of the Invention

The present invention relates to a semiconductor device, and more particularly to a structure of a Metal Insulator Metal (hereinafter referred to as MIM) capacitor element.

2. Description of the Background Art

In recent years, demand for a capacitor element in an analog circuit having a high precision and a high capacitance has increased. Conventionally, a gate capacitor element or a PIP (Poly Si Insulator Poly Si) capacitor element has been mounted in an analog circuit as a capacitor element. However, the structures of these capacitor elements have problems such as (i) high electrode resistance and (ii) dependence of capacitance value on voltage due to change in film thickness of the depletion layer and, therefore, they are not appropriate as high precision capacitor elements. In addition, in contrast to a manufacturing process for a semiconductor device that does not include a PIP capacitor element, an extra step of heat treatment, which affects the characteristics of a transistor and a resistance element with a high precision, becomes necessary in a manufacturing process for a semiconductor device having a PIP capacitor element and, therefore, it has been difficult to control the manufacturing process by taking these characteristics into consideration.

On the other hand, Metal Insulator Metal (hereinafter referred to as MIM capacitor elements disclosed in Japanese Patent Laying-Open No. 2000-228497, Japanese Patent Laying-Open No. 2000-101023, U.S. Pat. No. 5,926,359 and the like have advantages such as (i) reduced resistance of electrodes, (ii) no dependence of capacitor value on voltage due to a depletion layer, and (iii) an extra heat treatment is unnecessary at the time of the formation of an MIM structure because the upper layer electrodes and the lower layer electrodes have metal structures, so that MIM capacitor elements have come to be utilized in place of PIP capacitor elements in analog circuits.

In the case that an MIM capacitor element is used in an analog circuit, however, it is necessary to achieve optimization of the structure and of the manufacturing process of the MIM capacitor element concerning the enhancement of reliability (lifetime) and performance.

Here, the structure of a semiconductor device having a conventional MIM capacitor element will be described in reference to FIG. 20. A lower layer electrode layer 8 is formed on top of an interlayer insulating film 1 and a dielectric film 9 as well as an upper layer electrode layer 10 having a predetermined form are provided on top of this lower layer electrode layer 8 in the structure of the semiconductor device. Lower layer electrode layer 8 has a TiN layer 2, an AlCu layer 3 and a TiN/Ti layer 4. In addition, upper layer electrode layer 10 has a TiN layer 5, an AlCu layer 6 and a TiN/Ti layer 7.

A reflection prevention film 12 and an interlayer insulating film 13 are provided in the upper surface region of upper layer electrode layer 10 and of lower layer electrode layer 8. In addition, via holes 14 reaching to upper layer electrode layer 10 are provided in interlayer insulating film 13, and wire layers 15 are formed in these via holes 14.

In the semiconductor device of the above described structure, a problem can be cited wherein a leak current is generated, as indicated by the circled regions of FIG. 20, between lower layer electrode layer 8 and upper layer electrode layer 10 via reflection prevention film 12 in the case that a conductive material such as a plasma SiON film, for example, is used as reflection prevention film 12.

SUMMARY OF THE INVENTION

An object of the present invention is to achieve an improvement in the structure of an MIM capacitor element and to achieve a further improvement in the manufacturing process of an MIM capacitor element in a semiconductor device wherein the MIM capacitor element is used, to thereby make it possible to enhance reliability (lifetime) and performance of the MIM capacitor element.

A semiconductor device according to the present invention is a semiconductor device having a capacitor element formed of a lower layer electrode layer, a dielectric layer provided on the lower layer electrode layer and an upper layer electrode layer provided on the dielectric layer, which are layered, and includes an insulating film for covering the upper layer electrode layer and a reflection prevention film provided to the upper layer electrode layer with the insulating film intervened therebetween.

According to the semiconductor device, an insulating film is provided as a leak guard covering the upper layer electrode layer between the upper layer electrode layer and the reflection prevention film and, therefore, a region where the upper layer electrode layer and the reflection prevention film make contact with each other is not formed. As a result, it becomes possible to completely prevent the generation of a leak current between the upper layer electrode layer and the lower layer electrode layer. As a result, it becomes possible to improve the reliability and the performance of the operational characteristics of the semiconductor device provided with an MIM capacitor element having a lower layer electrode layer, a dielectric layer and an upper layer electrode layer.

In addition, in the semiconductor device, the upper layer electrode layer is preferably provided so as to have a width that is smaller than the width of the dielectric layer. The insulating film is provided so as to cover the exposed edge surfaces of the upper layer electrode layer and the upper surface region. The reflection prevention film is provided so as to cover the edge surface regions of the insulating layer and the edge surface regions of the dielectric layer. In addition, in the present invention, the reflection prevention film is more preferably provided so as to also cover the upper surface region of the insulating layer.

With this configuration, the edge surface regions, as well as the upper surface region, of the upper layer electrode layer are covered with an insulating film as a leak guard and a reflection prevention film is provided on top of this insulating film, thereby it becomes possible to completely prevent the occurrence of a leak current between the upper layer electrode layer and the lower layer electrode layer.

In addition, in accordance with a semiconductor device according to another aspect of the present invention, the reflection prevention film is provided in only the upper surface region of the insulating layer. With this configuration, the upper surface region of the upper layer electrode layer is covered with an insulating film as a leak guard and a reflection prevention film is provided on the insulating film, thereby it becomes possible to completely prevent the generation of a leak current between the upper layer electrode layer and the lower layer electrode layer.

In addition, in the semiconductor device, the upper layer electrode layer is preferably provided so as to have a width that is approximately the same as the width of the dielectric layer. The insulating layer is provided so as to cover the edge surface regions and the upper surface region of the upper layer electrode layer as well as the edge surface regions of the dielectric layer. The reflection prevention film is provided on the lower layer electrode layer so as to be isolated, by means of the insulating layer, from the upper layer electrode layer and from the dielectric layer.

With this configuration, the edge surface regions of the upper layer electrode layer are covered with an insulating film as a leak guard and a reflection prevention film is provided with this insulating film intervened therebetween, thereby it becomes possible to completely prevent the generation of a leak current between the upper layer electrode layer and the lower layer electrode layer.

A common photomask is utilized for patterning the upper layer electrode layer and for patterning the insulating film as well as the dielectric layer, thereby it becomes possible to achieve a reduction in manufacturing cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 21:
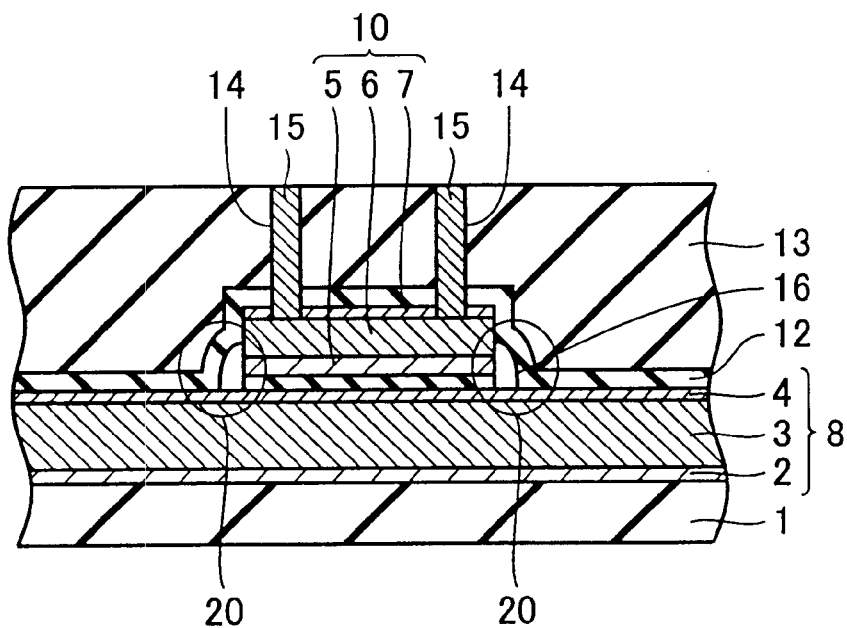
FIG. 21 is a cross sectional view showing a structure of a semiconductor device having an MIM capacitor element.

In order to solve the on described problems, sidewalls made of an insulating material are provided in, for example, the side regions of upper layer electrode layer 10, as shown in FIG. 21, thereby the generation of a leak current between lower layer electrode layer 8 and upper layer electrode layer 10 via reflection prevention film 12 can be prevented.

In the case that sidewalls are provided in such a manner, however, a microscopic leak current generates in regions wherein sidewalls are not provided and, therefore, in some cases, the generation of a leak current between lower layer electrode layer 8 and upper layer electrode layer 10 may not be completely preventable due to reflection prevention film 12.

In the following, semiconductor devices and manufacturing methods for the same according to the respective embodiments of the present invention will be described in reference to the drawings.

First Embodiment

A semiconductor device and a manufacturing method for the same according to the present embodiment will be described in reference to FIGS. 1 to 7.

(Cross Sectional Structure)

First, the structure of the semiconductor device having an MIM capacitor element according to the present embodiment will be described in reference to FIG. 1. In the structure of this semiconductor device, a lower layer electrode layer 8 is formed on an interlayer insulating film 1 and a dielectric film 9 having a predetermined width is provided on lower layer electrode layer 8. An upper layer electrode layer 10 having a width smaller than the width of dielectric film 9 is provided on dielectric film 9.

A leak guard 17 made of an insulator such as a plasma TEOS is provided so as to cover the upper surface region of dielectric film 9 and the upper surface region as well as the edge surface regions of upper layer electrode layer 10. A reflection prevention film 12 made of a plasma silicon oxide film or the like is provided so as to cover the upper surface region and the edge surface regions of leak guard 17, the edge surface regions of dielectric film 9 as well as the exposed upper surface region of lower layer electrode layer 8. Reflection prevention film 12 is used in a manufacturing process of wire patterning in regions that are not shown.

Note that lower layer electrode layer 8 has a TiN layer 2, an AlCu layer 3 and a TiN/Ti layer 4. In addition, upper layer electrode layer 10 has a TiN layer 5, an AlCu layer 6 and a TiN/Ti layer 7.

An interlayer insulating film 13 is provided so as to cover reflection prevention film 12, and via holes 14 which reach to upper layer electrode layer 10 are provided in this interlayer insulating film 13, so that wire layers 15 are provided in via holes 14.

(Manufacturing Process)

Next, a manufacturing method for a semiconductor device having the above described configuration will be described in reference to FIGS. 2 to 7. First, in reference to FIG. 2, a lower layer electrode layer 8 is formed on an interlayer insulating film. Lower layer electrode layer 8 has a TiN layer 2, an AlCu layer 3 and a TiN/Ti layer 4 and, as for the film thicknesses of the respective layers, TiN layer 2 has a thickness of approximately 50 nm, AlCu layer 3 has a thickness of approximately 300 nm and TiN/Ti layer 4 has a thickness of approximately 30 nm/2 nm.

Next, a dielectric film 9 made of a plasma TEOS oxide film or the like is formed on lower layer electrode layer 8. The film thickness of dielectric film 9 is approximately 50 nm.

Next, an upper layer electrode layer 10 is formed on dielectric film 9. Upper layer electrode layer 10 has a TiN layer 5, an AlCu layer 6 and a TiN/Ti layer 7 and, as for the film thicknesses of the respective layers, TiN layer 5 has a thickness of approximately 50 nm, AlCu layer 6 has a thickness of approximately 100 nm and TiN/Ti layer 7 has a thickness of approximately 30 nm/2 nm. After that, a resist film 11a having a predetermined pattern form is formed on upper layer electrode layer 10 using photomechanical technology.

Figure 3:
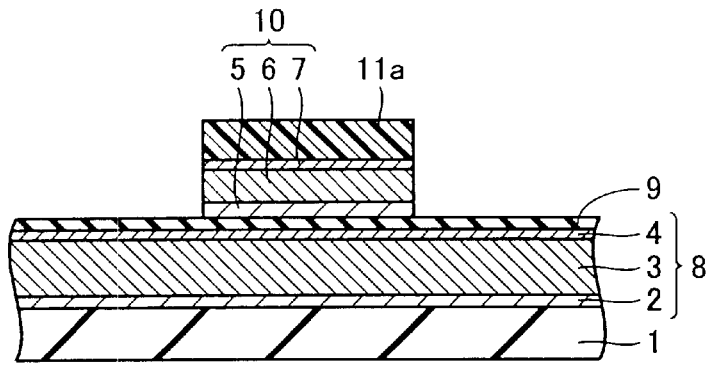

Next, in reference to FIG. 3, upper layer electrode layer 10 is patterned using resist film 11a as a mask. Electrode layer 10 is patterned by means of reactive ion etching and $Cl_2$ (base), for example, or the like is used as a reactive gas.

Figure 4:
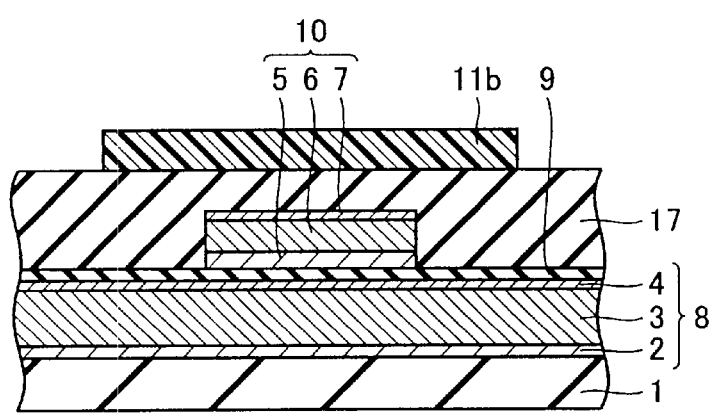

Next, in reference to FIG. 4, an insulating layer 17 made of a plasma TEOS oxide film or the like is formed so as to cover the upper surface region and the edge surface regions of patterned upper layer electrode layer 10 as well as the upper surface region of exposed dielectric film 9. The film thickness of this insulating layer 17 is approximately 50 nm to 300 nm.

Next, a resist film 11b having a width greater than the width of upper layer electrode layer 10 is formed on insulating layer 17 using photomechanical technology so as to encompass the width of upper layer electrode layer 10.

Figure 5:
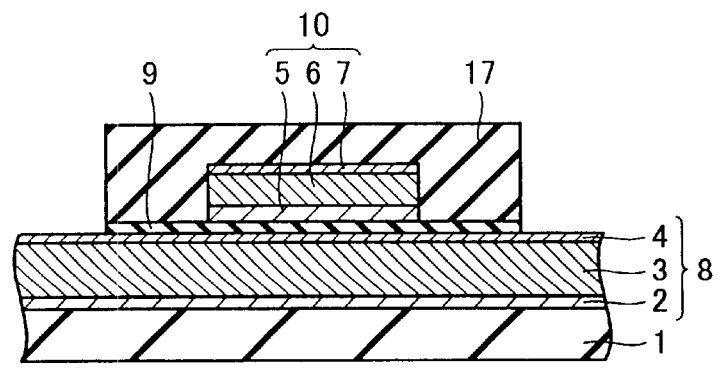

Next, in reference to FIG. 5, insulating layer 17 is patterned using resist film 11b as a mask so as to complete leak guard 17. In addition, dielectric film 9 is simultaneously patterned. Dielectric film 9 is patterned by means of reactive ion etching and $Cl_2$ (base), for example, or the like is used as a reactive gas.

Figure 6:
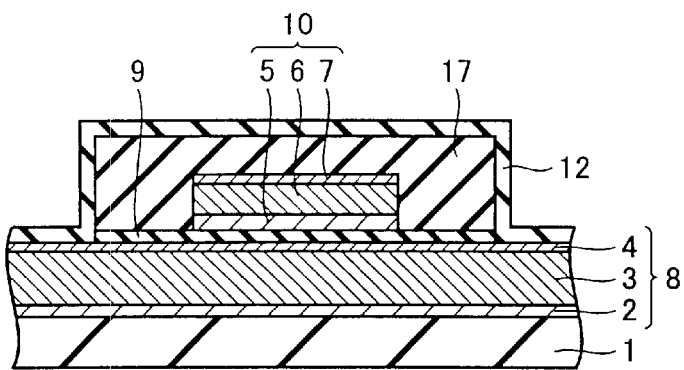
Figure 7:
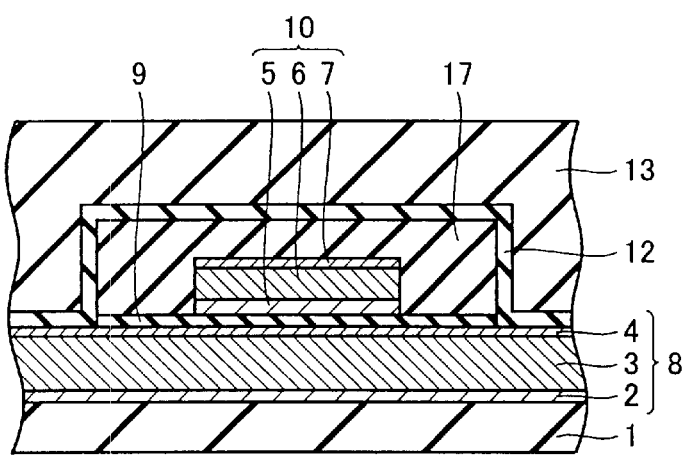

Next, in reference to FIG. 6, a reflection prevention film 12 made of plasma SiON or the like is formed so as to cover the upper surface region and edge surface regions of leak guard 17, the edge surface regions of exposed dielectric film 9 as well as the upper surface region of exposed lower layer electrode layer 8. The film thickness of reflection prevention film 12 is approximately 50 nm.

Next, an interlayer insulating film 13 made of a plasma TEOS oxide film or the like is formed on reflection prevention film 12. After that, via holes 14, which reach to upper layer electrode layer 10, are formed in interlayer insulating film 13 using photomechanical technology or the like and wire layers 15 are formed within these via holes 14, so that a semiconductor device having the structure shown in FIG. 1 is completed.

(Working Effects)

As described above, in accordance with the semiconductor device and the manufacturing method for the same according to the present embodiment, leak guard 17, which covers upper layer electrode layer 10, is provided between upper layer electrode layer 10 and reflection prevention film 12 and, therefore, a region where upper layer electrode layer 10 and reflection prevention film 12 make direct contact with each other is not formed. As a result, it becomes possible to completely prevent the generation of a leak current between upper layer electrode layer 10 and lower layer electrode layer 12. Thereby, it becomes possible to increase the reliability of an MIM capacitor element.

Second Embodiment

Figure 8:
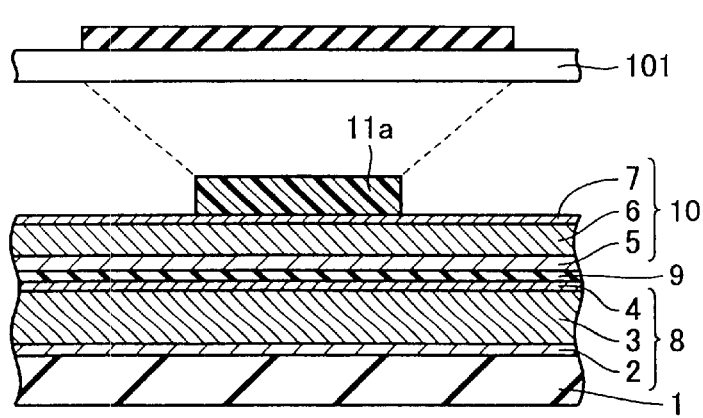
FIG. 8 is a view of the first manufacturing step showing a manufacturing method for a semiconductor device having an MIM capacitor element according to a second embodiment.

Next, a semiconductor device and a manufacturing method for the same according to a second embodiment will be described in difference to FIGS. 8 and 9.

Figure 1:
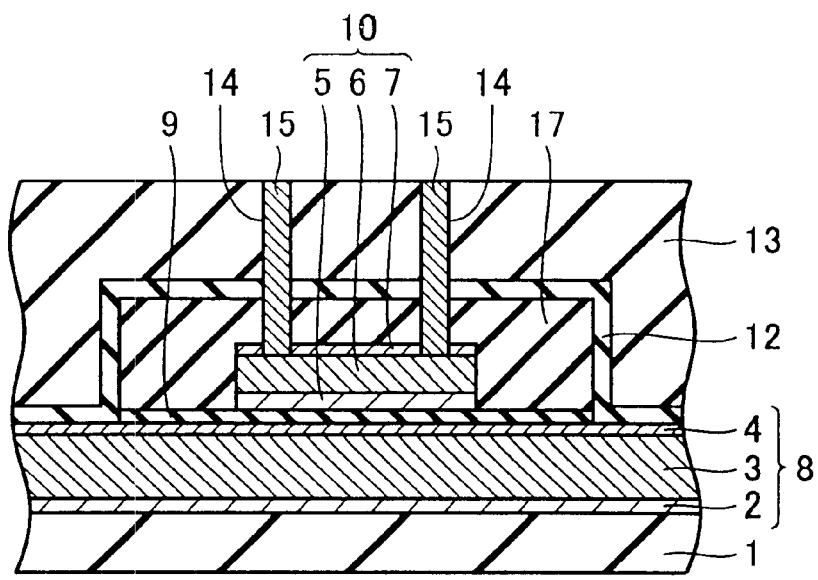
FIG. 1 is a cross sectional view showing a structure of a semiconductor device having an MIM capacitor element according to a first embodiment.

The present embodiment is characterized by the manufacturing method while the structure of the formed semiconductor device is the same as the above described structure of the first embodiment shown in FIG. 1.

Figure 2:
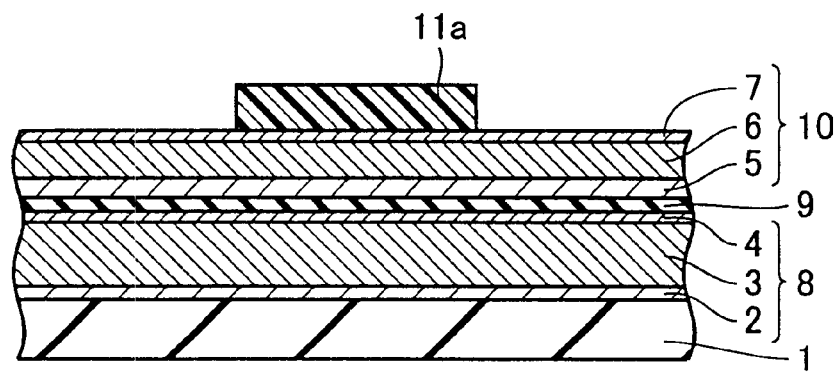
FIGS. 2 to 7 are views of first to sixth manufacturing steps showing a manufacturing method for a semiconductor device in accordance with the cross sectional structure of FIG. 1.

In the manufacturing process according to the first embodiment, a negative-type resist film is used for the formation of resist films 11a and 11b in the steps shown in FIGS. 2 and 4, so that photomasks having the corresponding pattern forms, respectively, are formed so as to pattern resist films 11a and 11b.

In the present embodiment, a positive-type resist film is used, thereby it becomes possible to pattern resist films 11a and 11b by using one photomask. More specifically, first, a photomask 101 having a predetermined pattern formation is prepared in the step shown in FIG. 8 and a positive-type resist film is overexposed by using photomask 101. As for the over exposure, the amount of exposure (period of time) is increased, so that the diffraction phenomenon of KrF rays, which serve as the exposure light, for example, is enhanced, thereby only regions smaller than the light blocking pattern of photomask 101 are blocked from light. Thereby, resist film 11a having a width that is the same width required in upper layer electrode layer 10 is formed.

Figure 9:
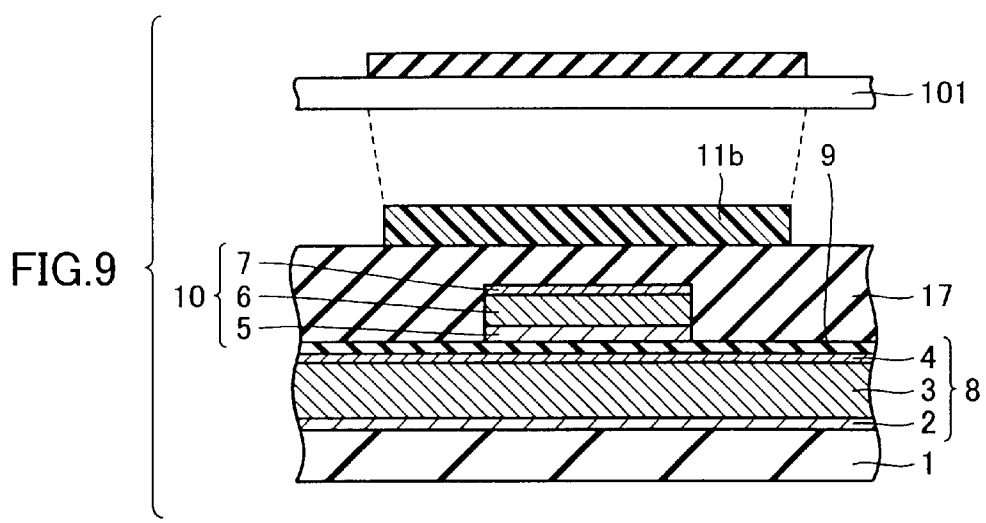
FIG. 9 is a view of the second manufacturing step showing the manufacturing method for a semiconductor device having an MIM capacitor element according to the second embodiment.

In addition, in the step shown in FIG. 9, photomask 101 used in the above described step is again utilized so as to underexpose the positive-type resist film formed on insulating layer 17. The amount (period of time) of exposure is reduced in this underexposure, thereby the diffraction phenomenon of KrF rays, which serve as the exposure light, can be limited to a small amount, for example, and, therefore, it becomes possible to block light in regions larger than of the above described case. Thereby, a resist film 11b having the same width as the width required for insulating layer 17 is formed.

(Working Effects)

In accordance with the above described semiconductor device and manufacturing method for the same according to the present embodiment, the same working effects as in the above described case of the first embodiment can be obtained. Furthermore, a positive-type resist film is adopted in the case of the formation of resist films 11a and 11b, thereby a common photomask is utilized for patterning resist films 11a and 11b, so that it becomes possible to achieve a reduction in the manufacturing costs for the manufacture of the semiconductor device.

Third Embodiment

Next, a semiconductor device and a manufacturing method for the same according to the third embodiment will be described in reference to FIGS. 10 to 13. Note that the same reference numerals are attached to the same or corresponding parts as in the first embodiment, of which the detailed descriptions will not be repeated.

(Cross Sectional Structure)

Figure 10:
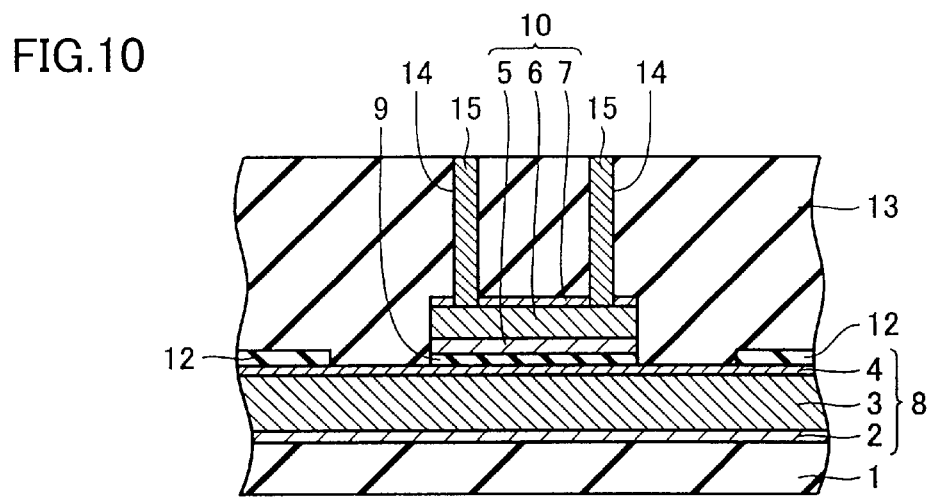
FIG. 10 is a cross sectional view showing a structure of a semiconductor device having an MIM capacitor element according to a third embodiment.

In reference to FIG. 10, the cross sectional structure of the semiconductor device according to the present embodiment is characterized by the point that the upper surface region and the side regions of upper layer electrode layer 10 are entirely covered with interlayer insulating film 13, thereby the semiconductor device has a structure wherein reflection prevention film 12 provided on lower layer electrode layer 8 and upper layer electrode layer 10 are isolated from each other, in contrast to the above described structure of the first embodiment.

(Manufacturing Process)

Next, a manufacturing method for the semiconductor device having the above described structure will be described in reference to FIGS. 11 to 13. First, in reference to FIG. 11, the same steps as in the first embodiment are adopted, as shown in FIG. 2, up to the formation of lower layer electrode layer 8, dielectric film 9, upper layer electrode layer 10 and resist film 11a. Next, the patterning of upper layer electrode layer 10 and of dielectric film 9 is simultaneously carried out using resist film 11a as a mask. The patterning of upper layer electrode layer 10 and of dielectric film 9 is carried out through reactive ion etching wherein $Cl_2$ (base) or the like, for example, is used as a reactive gas.

Figure 11:
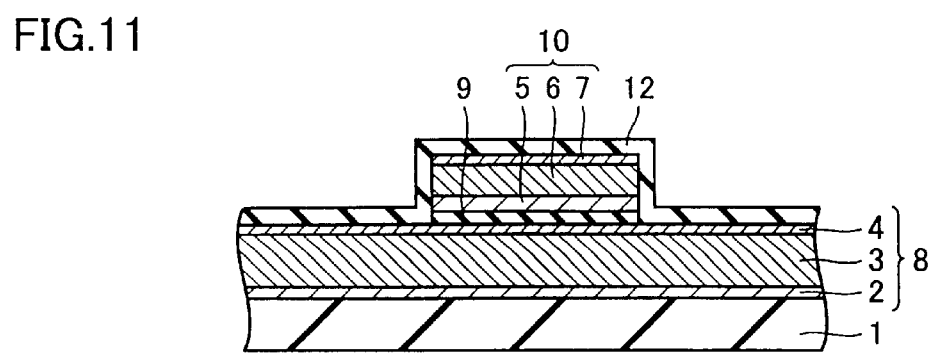
FIGS. 11 to 13 are views of the first to third manufacturing steps showing a manufacturing method for a semiconductor device in accordance with the cross sectional structure of FIG. 10.

Next, in reference to FIG. 11, a reflection prevention film 12 made of plasma SiON or the like is formed so as to cover the upper surface region and edge surface regions of upper layer electrode layer 10, the edge surface regions of dielectric film 9 as well as the exposed regions of lower layer electrode layer 8. The film thickness of this reflection prevention film 12 is approximately 50 nm.

Figure 12:
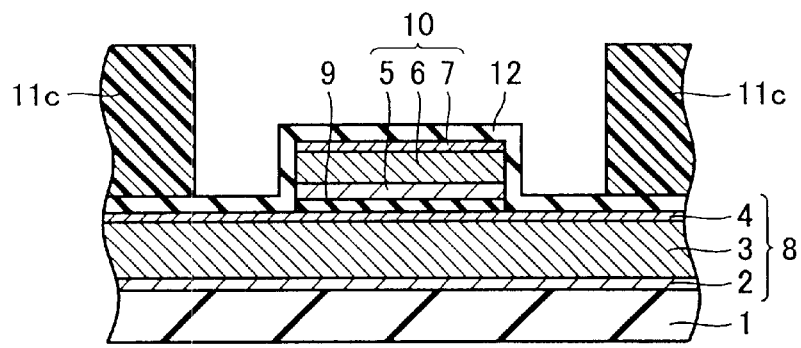

Next, in reference to FIG. 12, upper layer electrode layer 10 covered with reflection prevention film 12 is exposed, and a resist film 11c having an opening that contains upper layer electrode layer 10 is formed on reflection prevention film 12 using photomechanical technology.

Figure 13:
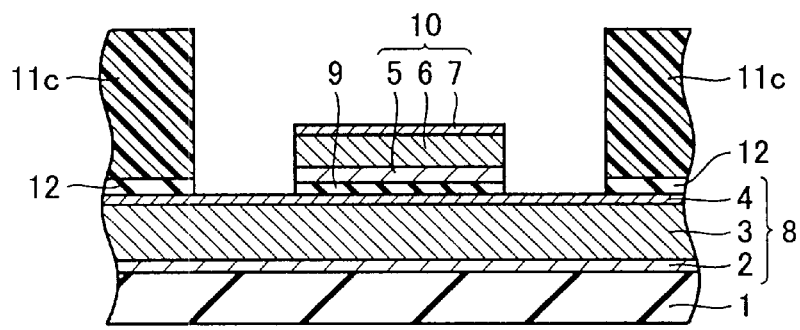

Next, in reference to FIG. 13, only reflection prevention film 12 is removed through patterning using resist film 11c as a mask. The patterning of reflection prevention film 12 is carried out through reactive ion etching wherein $Cl_2$ (base) or the like, for example, is used as a reactive gas. After that, an interlayer insulating film 13 is formed so as to cover upper layer electrode layer 10, lower layer electrode layer 8 and reflection prevention film 12 after the removal of resist film 11c. After that, via holes 14 that reach to upper layer electrode layer 10 are formed in interlayer insulating film 13 using photomechanical technology or the like and wire layers 15 are formed within these via holes 14, thereby a semiconductor device having the structure shown in FIG. 10 is completed.

(Working Effects)

As described above, in accordance with the semiconductor device and the manufacturing method for the same according to the present embodiment, reflection prevention film 12 is formed in the regions isolated from the edge surface portions of upper layer electrode layer 10 by interlayer insulating film 13 and, therefore, a region wherein upper layer electrode layer 10 and reflection prevention film 12 make direct contact with each other is not formed. As a result, it becomes possible to completely prevent the generation of a leak current between upper layer electrode layer 10 and lower layer electrode layer 12. Thereby, it becomes possible to enhance the reliability of the MIM capacitor element.

Fourth Embodiment

Next, a semiconductor device and a manufacturing method for the same according to the fourth embodiment will be described in reference to FIGS. 14 to 16. Note that the same reference numerals are attached to the same or corresponding parts as in the first embodiment, of which the detailed descriptions will not be repeated.

(Cross Sectional Structure)

Figure 14:
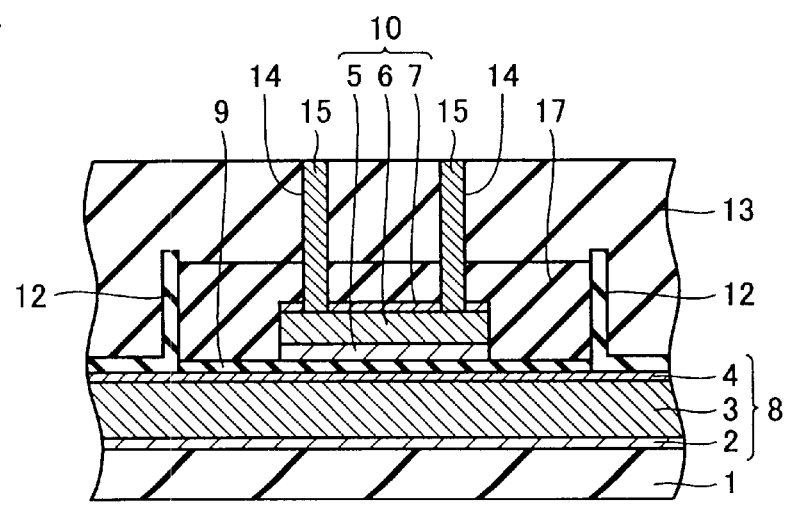
FIG. 14 is a cross sectional view showing a structure of a semiconductor device having an MIM capacitor element according to a fourth embodiment.

In reference to FIG. 14, the cross sectional structure of the semiconductor device according to the present embodiment is characterized in the point that the semiconductor device has a structure wherein reflection prevention film 12 is provided on only the side regions of leak guard 17, in contrast to the above described structure of the first embodiment.

(Manufacturing Process)

Next, a manufacturing method for the semiconductor device having the above described structure will be described in reference to FIGS. 15 and 16. First, in reference to FIG. 15, the steps up to the formation of lower layer electrode layer 8, dielectric film 9, upper layer electrode layer 10, leak guard 17 and reflection prevention film 12 follow the manufacturing process having the same steps shown in FIGS. 2 to 6, according to the first embodiment.

Figure 15:
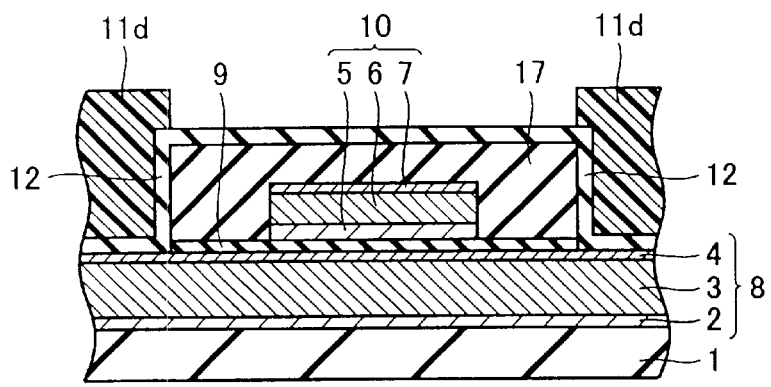
FIGS. 15 and 16 are views of the first and second manufacturing steps showing a manufacturing method for a semiconductor device according to the cross sectional structure of FIG. 14.

Next, in reference to FIG. 15, a resist film 11d, having an opening that exposes reflection prevention film 12 on upper layer electrode layer 10 and covering reflection prevention film 12 formed on the sidewall portions of leak guard 17 and on the upper surfaces of lower layer electrode layer 8, is formed using photomechanical technology.

Figure 16:
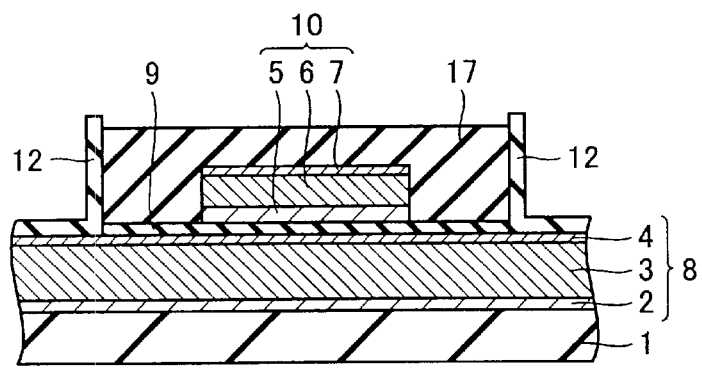

Next, in reference to FIG. 16, only reflection prevention film 12 formed on the upper surface region of leak guard 17, is removed through patterning using resist film 11d as a mask. Patterning of reflection prevention film 12 is carried out by means of reactive ion etching, wherein $Cl_2$ (base) or the like, for example, is used as a reactive gas. After that, an interlayer insulating film 13 is formed so as to cover upper layer electrode layer 10, lower layer electrode layer 8 and reflection prevention film 12 after resist film 11d has been removed. After that, via holes 14 which reach to upper layer electrode layer 10 are formed in interlayer insulating film 13 using photomechanical technology or the like, and wire layers 15 are formed within these via holes 14, thereby a semiconductor device having the structure shown in FIG. 14 is completed.

(Working Effects)

In the case of the structure according to the first embodiment, there is a slight risk of the generation of a leak current between upper layer electrode layer 10 and lower layer electrode layer 8 due to the existence of a path starting from upper layer electrode layer 10, to wire layers 15, to reflection prevention film 12 and to lower layer electrode layer 8. In the present embodiment, however, reflection prevention film 12 is provided only on the sidewall portions of leak guard 17 and, therefore, a region wherein wire layers 15 and reflection prevention film 12 make contact with each other is not formed. As a result, the electrical path between upper layer electrode layer 10 and lower layer electrode layer 8 is completely blocked, so that it becomes possible to completely prevent the occurrence of a leak current between upper layer electrode layer 10 and lower layer electrode layer 12. Thereby, it becomes possible to enhance the reliability of the MIM capacitor element.

Fifth Embodiment

Next, a semiconductor device and a manufacturing method for the same according to the fifth embodiment will be described in reference to FIGS. 17 to 19. Note that the same reference numerals are attached to the same or corresponding parts as in the first embodiment, of which the detailed descriptions will not be repeated.

(Cross Sectional Structure)

Figure 17:
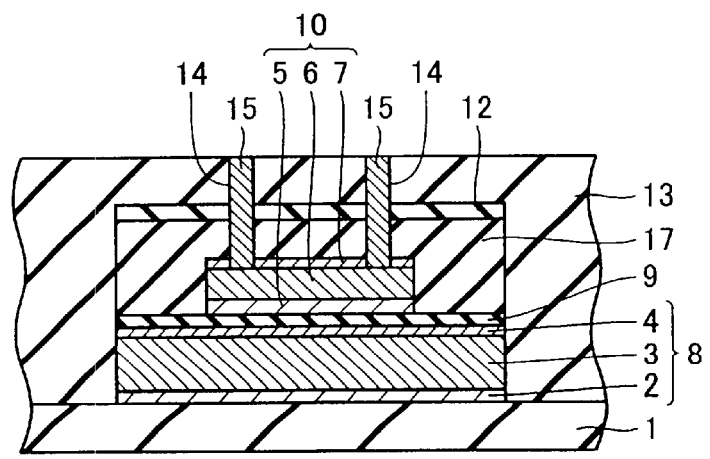
FIG. 17 is a cross sectional view showing a structure of a semiconductor device having an MIM capacitor element according to a fifth embodiment.
Figure 18:
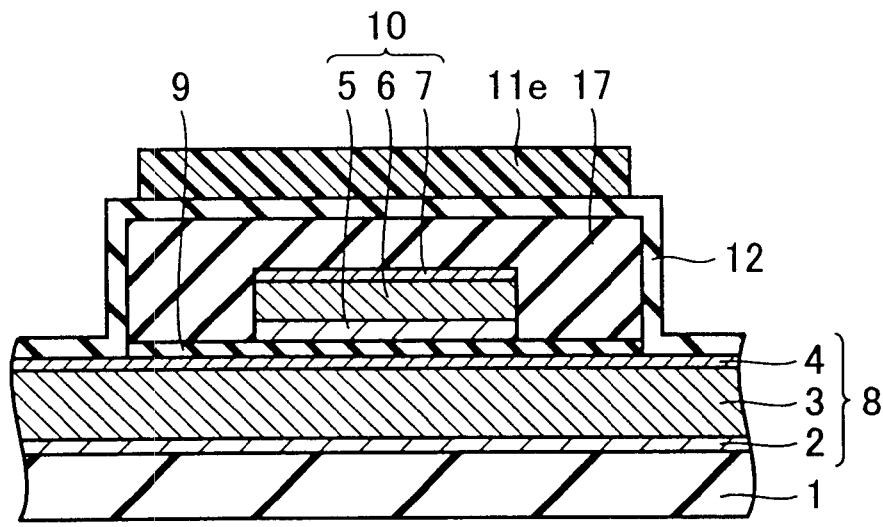
FIGS. 18 and 19 are views of the first and second manufacturing steps showing a manufacturing method for a semiconductor device according to the cross sectional structure of FIG. 17.

In reference to FIG. 17, the cross sectional structure of the semiconductor device according to the present embodiment is characterized by the point that the semiconductor device has a structure wherein reflection prevention film 12 is provided only on the upper surface region of leak guard 17, in contrast to the above described structure of the first embodiment.

(Manufacturing Process)

Next, in reference to FIGS. 18 and 19, a manufacturing method for the semiconductor device having the above described structure will be described. First, in reference to FIG. 18, the steps up to the formation of lower layer electrode layer 8, dielectric film 9, upper layer electrode layer 10, leak guard 17 and reflection prevention film 12 follow the manufacturing process having the same steps as shown in FIGS. 2 to 6 according to the first embodiment.

Next, a resist film 11e, covering reflection prevention film 12 on upper layer electrode layer 10 and leaving exposed reflection prevention film 12 formed on the sidewall portions of leak guard 17 and on the upper surfaces of lower layer electrode layer 8, is formed using photomechanical technology.

Figure 19:
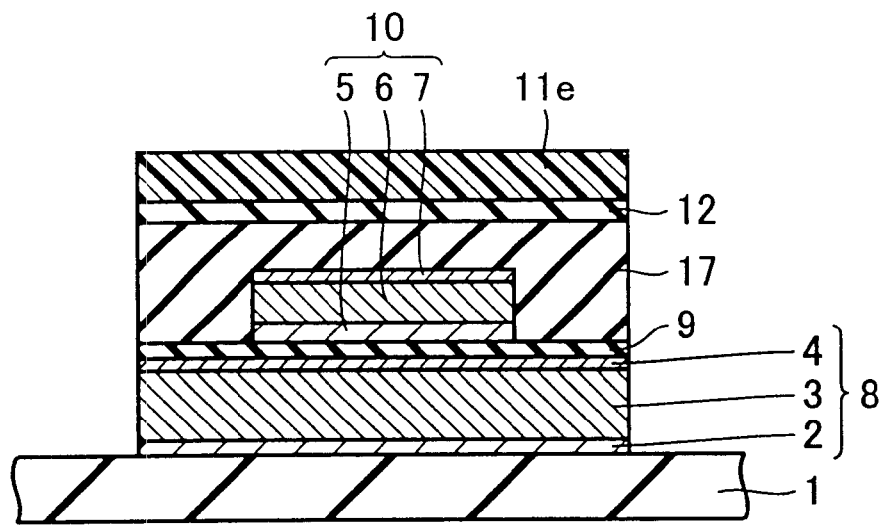
Figure 20:
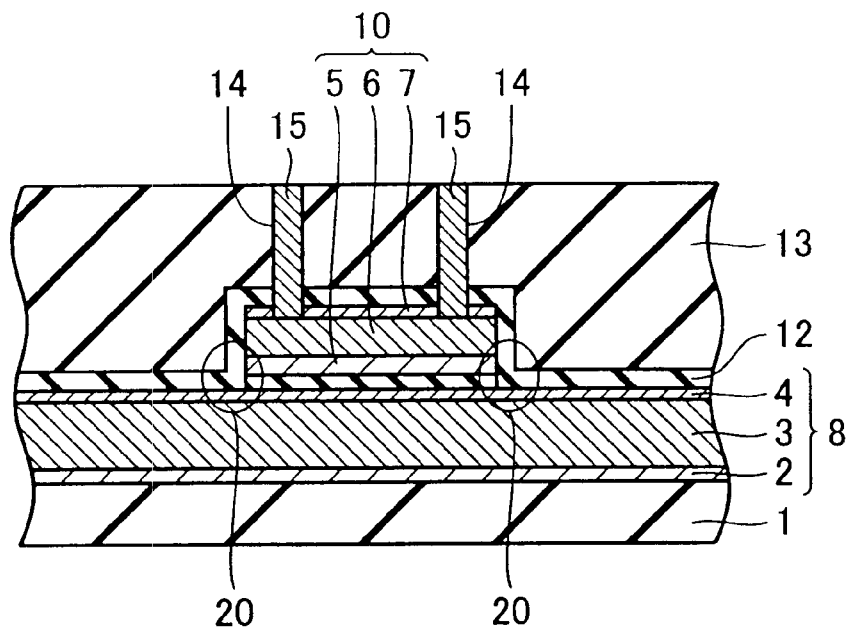
FIG. 20 is a cross sectional view showing a structure of a semiconductor device having an MIM capacitor element according to a prior art.

Next, in reference to FIG. 19, reflection prevention film 12 in the regions other than the upper surface region of leak guard 17 is removed through patterning using resist film 11e as a mask so as to leave the reflection prevention film 12 that is formed in this region. The patterning of reflection prevention film 12 is carried out by means of reactive ion etching, wherein $Cl_2$ (base) or the like, for example, is used as a reactive gas. After that, an interlayer insulating film 13 is formed so as to cover upper layer electrode layer 10, lower layer electrode layer 8 and reflection prevention film 12 after resist film 11e has been removed. After that, via holes 14, which reach to upper layer electrode layer 10, are formed in interlayer insulating film 13, and wire layers 15 are formed within these via holes 14, thereby a semiconductor device having the structure shown in FIG. 17 is completed.

(Working Effects)

In the case of the structure according to the first embodiment, there is a slight risk of the generation of a leak current between upper layer electrode layer 10 and lower layer electrode layer 8 due to the existence of a path starting from upper layer electrode layer 10, to wire layers 15, to reflection prevention film 12 and to lower layer electrode layer 8. In the present embodiment, however, reflection prevention film 12 is provided only on the upper portion region of leak guard 17 and, therefore, a region wherein reflection prevention film 12 and lower layer electrode layer 8 make contact with each other is not formed. As a result, the electrical path between upper layer electrode layer 10 and lower layer electrode layer 8 is completely blocked, so that it becomes possible to completely prevent the generation of a leak current between upper layer electrode layer 10 and lower layer electrode layer 12. Thereby, it becomes possible to enhance the reliability of the MIM capacitor element.

Here, it is possible to use either a negative-type or a positive-type resist film in the above described respective embodiments, unless otherwise stated.

In accordance with the above described semiconductor devices according to the present invention, an insulating film, as a leak guard for covering the upper layer electrode layer, is provided between the upper layer electrode layer and the reflection prevention film and, therefore, a region wherein the upper layer electrode layer and the reflection prevention film make contact with each other is not formed. As a result, it becomes possible to completely prevent the generation of a leak current between the upper layer electrode layer and the lower layer electrode layer. As a result, it becomes possible to enhance the reliability of the operational characteristics of the semiconductor device provided with an MIM capacitor element having a lower layer electrode layer, a dielectric layer and an upper layer electrode layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a capacitor element formed of a lower layer electrode layer, a dielectric layer provided on said a lower layer electrode layer, and an upper layer electrode layer provided on said dielectric layer, which are layered, comprising:

an insulating film for covering said upper layer electrode layer; and a reflection prevention film provided to said upper layer electrode layer with said insulating film intervened therebetween.

2. The semiconductor device according to claim 1, wherein said upper layer electrode layer is provided so as to have a width smaller than the width of said dielectric layer, said insulating film is provided so as to cover an exposed edge surface region and an upper surface region of said upper layer electrode layer, and said reflection prevention film is provided so as to cover an edge surface region of said insulating layer and an edge surface region of said dielectric layer.

3. The semiconductor device according to claim 2, wherein said reflection prevention film is provided so as also to cover an upper surface region of said insulating layer.

4. The semiconductor device according to claim 1, wherein said reflection prevention film is provided only on the upper surface region of said insulating layer.

5. The semiconductor device according to claim 1, wherein said upper layer electrode layer is provided so as to have a width that is approximately the same width of said dielectric layer, said insulating layer is provided so as to cover the edge surface region and the upper surface region of said upper layer electrode layer as well as the edge surface regions of said dielectric layer, and said reflection prevention film is provided on said lower layer electrode layer so as to be isolated from said upper layer electrode layer and from said dielectric layer by means of said insulating layer.

* * * * *